United States Patent [19]
Tanaka

[11] Patent Number: 6,162,723
[45] Date of Patent: Dec. 19, 2000

[54] METHOD OF FABRICATING A SEMICONDUCTOR INTEGRATED CIRCUIT DEVICE HAVING AN INTERLEVEL DIELECTRIC LAYER WITH VOIDS BETWEEN NARROWLY-SPACED WIRING LINES

[75] Inventor: Motoko Tanaka, Tokyo, Japan

[73] Assignee: NEC Corporation, Tokyo, Japan

[21] Appl. No.: 09/211,200

[22] Filed: Dec. 14, 1998

Related U.S. Application Data

[62] Division of application No. 08/884,145, Jun. 27, 1997, abandoned.

[30] Foreign Application Priority Data

Jun. 27, 1996 [JP] Japan ................................. 8-167386

[51] Int. Cl.[7] ............................................. H01L 21/443
[52] U.S. Cl. ........................ 438/638; 438/624; 438/788
[58] Field of Search ................................. 438/637, 638, 438/778, 624, 631, 701, 703, 978, 787, 788, 789, 937, 959

[56] References Cited

U.S. PATENT DOCUMENTS

| | | | |
|---|---|---|---|
| 5,545,919 | 8/1996 | Ueda et al. .............................. | 257/641 |
| 5,698,901 | 12/1997 | Endo ...................................... | 257/758 |
| 5,773,361 | 6/1998 | Cronin et al. ........................... | 438/637 |
| 5,837,618 | 11/1998 | Avanzino et al. ...................... | 438/778 |
| 5,856,703 | 1/1999 | Manning ................................. | 257/632 |
| 5,955,786 | 9/1999 | Avanzino et al. ...................... | 257/758 |
| 5,981,397 | 11/1999 | Manning ................................. | 438/701 |

FOREIGN PATENT DOCUMENTS 5-283542  10/1993  Japan .
7-114236  12/1995  Japan .

*Primary Examiner*—Mary Wilczewski
*Attorney, Agent, or Firm*—Laff, Whitesel & Saret, Ltd.; J. Warren Whitesel

[57] ABSTRACT

A semiconductor integrated circuit device selectively decreasing the parasitic capacitance between wiring lines of a wiring layer is provided. This device is comprised of a semiconductor substructure with a main surface, an insulating layer formed on the main surface of the substructure, a first patterned conductive layer formed on the insulating layer to serve as a first-level wiring layer, and an interlevel dielectric layer formed on the insulating layer to cover the first-level wiring layer. The first-level wiring layer includes a first plurality of wiring lines and a second plurality of wiring lines. The first plurality of wiring lines are located apart from each other at gaps equal to or smaller than a specific value. The second plurality of wiring lines are located apart from each other at gaps larger than the specific value. The interlevel dielectric layer includes voids selectively located in the gaps of the first plurality of wiring lines, thereby decreasing a parasitic capacitance between the first plurality of wiring lines. The tops of the voids are lower than the tops of the first-level wiring layer, respectively.

13 Claims, 9 Drawing Sheets

METHOD OF FABRICATING A SEMICONDUCTOR INTEGRATED CIRCUIT DEVICE HAVING AN INTERLEVEL DIELECTRIC LAYER WITH VOIDS BETWEEN NARROWLY-SPACED WIRING LINES

This is a divisional of Ser. No. 08/884,145 filed Jun. 27, 1997, now abandoned.

BACKGROUND OF THE INVENTION

1. Field of the Invention

The present invention relates to a semiconductor integrated circuit device and more particularly, to a semiconductor integrated circuit device, in which an interlevel dielectric layer has voids between narrow-spaced wiring lines in a same wiring layer, and a fabrication method of the device.

2. Description of the Prior Art

FIG. 1 shows a conventional, typical multilevel wiring structure of a semiconductor integrated circuit device.

In FIG. 1, a semiconductor substructure 101 has an insulating layer 101a on its main surface. The substructure 101 is typically comprised of a silicon substrate and a field oxide formed on the substrate, or of a silicon substrate and an interlevel dielectric layer formed on or over the substrate. Various semiconductor elements such as transistors are formed in the substructure 101.

A conductive layer 102 is formed on the insulating layer 101a. An anti-reflection layer 103 is formed on the conductive layer 102. The conductive layer 102 and the anti-reflection layer 103 constitute a first-level wiring layer W1.

An interlevel dielectric layer 104 is formed on the insulating layer 101a to cover the underlying wiring layer W1. The first-level wiring layer W1 is entirely buried in the dielectric layer 104.

Another conductive layer 105 is formed on the underlying interlevel dielectric layer 104. Another anti-reflection layer 106 is formed on the wiring layer 105. The conductive layer 105 and the anti-reflection layer 106 constitute a second-level wiring layer W2.

The conventional multilevel wiring structure of a semiconductor integrated circuit device shown in FIG. 1 is fabricated by the following process steps.

First, as shown in FIG. 2A, the semiconductor substructure 101 including specific semiconductor elements is prepared.

Next, two conductive layers are formed to be stacked on the insulating layer 101a of the substructure 101 by sputtering or the like. The stacked conductive layers are then patterned by photolithography and etching processes to thereby form the conductive layer 102 and the anti-reflection layer 103. The anti-reflection layer 103 serves to prevent irradiated exposure light from being reflected by the conductive layer 102 during the photolithography process. The state at this stage is shown in FIG. 2A.

Subsequently, the interlevel dielectric layer 104 is formed on the insulating layer 101a by Chemical Vapor Deposition (CVD) or the like in such a way that the conductive layer 102 and the anti-reflection layer 103 are entirely buried in the dielectric layer 104. The surface of the layer 104 is then planarized by a Chemical/Mechanical Polishing (CMP) process. The state at this stage is shown in FIG. 2B.

Further, two conductive layers are formed to be stacked on the interlevel dielectric layer 104 by sputtering or the like. The stacked conductive layers are then patterned by photolithography and etching processes to thereby form the conductive layer 105 and the anti-reflection layer 106. The anti-reflection layer 106 serves to prevent irradiated exposure light from being reflected by the conductive layer 105 during the photolithography process.

Following this, the interlevel dielectric layer 107 is formed on the interlevel dielectric layer 104 by CVD or the like in such a way that the conductive layer 105 and the anti-reflection layer 106 are entirely buried in the dielectric layer 107. Thus, the two-level wiring structure is fabricated as shown in FIG. 2C.

With the conventional semiconductor integrated circuit device shown in FIG. 1, the lower interlevel dielectric layer 104 electrically insulates (a) any one of wiring lines of the lower wiring layer W1 from another and (b) the upper wiring layer W2 from the lower wiring layer W1. The upper interlevel dielectric layer 107 electrically insulates any one of wiring lines of the upper wiring layer W2 from another.

Further, there is a problem that the circuit operation speed is very difficult to be increased due to parasitic capacitance between the adjoining wiring lines of the lower and upper wiring layers W1 and W2. Recently, this problem has become serious because submicron-order gaps between the wiring lines has been becoming popular.

The parasitic capacitance increases or decreases proportional to the dielectric constant of the interlayer dielectric layer 104 or 107 and inversely proportional to the gap or lateral distance between the adjoining wiring lines. Therefore, to increase the circuit operation speed while the integration level of circuits is kept high, the dielectric constant of the interlayer dielectric layers 104 and 107 needs to be decreased.

To realize the dielectric constant decrease, another conventional multilevel wiring structure of a semiconductor integrated circuit device as shown in FIG. 3 was developed. In this structure, miniaturized particles are mixed into a material for an interlevel dielectric layer and then, the particles are selectively etched out, resulting in the interlevel dielectric layer including a lot of micro voids. The voids are dispersed in the whole interlevel dielectric layer.

In FIG. 3, an insulating cap layer 208 is formed on a main surface of a semiconductor substructure 201. The substructure 201 is typically comprised of a silicon substrate and a field oxide formed on the substrate, or of a silicon substrate and an interlevel dielectric layer formed on or over the substrate. Various semiconductor elements such as transistors are formed in the substructure 201.

An interlevel dielectric layer 204 is formed on the insulating cap layer 208. The layer 204 has a lot of voids 213 dispersed within the whole layer 204. An insulating cap layer 209 is formed on the interlevel dielectric layer 204.

A wiring layer W1, which is formed by a patterned conductive layer 202, is located on the insulating cap layer 209. An insulating cap layer 210 is formed on the exposed cap layer 209 to cover the wiring layer W1.

An interlevel dielectric layer 207 is formed on the cap layer 210. The layer 207 has a lot of voids 215 dispersed within the whole layer 207. An insulating cap layer 212 is formed on the interlevel dielectric layer 207. The wiring layer 202 or W1 and the cap layer 210 are entirely buried in the interlevel dielectric layer 207.

Another wiring layer W2, which is formed by a patterned conductive layer 205, is located on the insulating cap layer 212.

The conventional multilevel wiring structure of a semiconductor integrated circuit device shown in FIG. 3 is fabricated by the following process steps.

First, as shown in FIG. 4A, the semiconductor substructure 201 is prepared. Next, a silicon dioxide (SiO$_2$) layer serving as the insulating cap layer 208 is formed on the main surface of the substructure 201 by a CVD or sputtering process.

A SiO$_2$-system, low-temperature-setting glass material, into which aluminum (Al) micro particles 214 with a small diameter in the order of submicrons have been mixed, is coated on the surface of the insulating cap layer 208, and is then cured under heat. Thus, an insulating layer 204a including the Al micro particles 214 is formed on the cap layer 208, as shown in FIG. 4B.

Next, using an etchant (e.g., NaOH or KOH) having an etching action to the Al particles 214 and no etching action to the glass material, the insulating layer 204a is etched to selectively remove the particles 214 in the cap layer 208, resulting in the voids 213. Thus, the interlayer dielectric layer 204 including the voids 213 is formed, as shown in FIG. 4C.

Following this, the insulating cap layer 209 is formed on the interlayer dielectric layer 204 by a CVD or sputtering process, as shown in FIG. 4D.

A metal layer is formed on the insulating cap layer 209, and then patterned by photolithography and etching processes to thereby form the wiring layer 202 or W1, as shown in FIG. 4E.

Further, the interlayer dielectric layer 207, the insulating cap layer 212, and the wiring layer 205 or W2 are successively formed on the interlayer dielectric layer 204 by the same process steps as those shown in FIGS. 4A to 4E. Thus, the two-level wiring structure as shown in FIG. 3 is fabricated.

With the conventional semiconductor integrated circuit device shown in FIG. 3, there are following problems.

First, the micro particles 214 are dispersed into the insulating material 204a and then, they are selectively etched away from the material 204a to form the voids 213. Further, the upper and lower cap layers 209 and 208 are necessarily formed in order to bury the opening voids 213 and 215, thereby planarizing the surface of the interlevel dielectric layer 204. Therefore, a problem that the fabrication process sequence is complicated occurs.

Second, the voids 213 are dispersed in the whole dielectric layer 204. Therefore, to use a CMP process, which is effective for surface planarization, the thin cap layer 212 needs to be selectively polished away. This is caused by the following reason.

Since the voids 215 are dispersed in the entire dielectric layer 207, the voids 215 located in the upper region of the dielectric layer 204 are exposed or opened during a CMP process. Water, which is used for the CMP process, tends to enter the opened voids 215 to reach the underlying wiring layer 202 through the unopened voids 215 and the cap layer 210. This water will cause corrosion damage to the wiring layer 210, thereby degrading the reliability of the semiconductor integrated circuit device.

To cope with the corrosion damage, the cap layer 212 needs to be very thick. However, this will degrade the fabrication yield or productivity.

Third, at present when the miniaturization of wiring lines have been progressed, the micro particles 214 tend not to be located in the narrow gaps or spaces between the wiring lines where the parasitic capacitance decrease is necessary and tend to be located in the wide gaps or spaces between the wiring lines where the parasitic capacitance decrease is not necessary. Thus, there is a problem that the parasitic capacitance is not always decreased for the miniaturized wiring lines.

A method of forming a multilevel wiring structure of a semiconductor integrated circuit device was disclosed in the Japanese Examined Patent Publication No. 7-114236 published in December 1995.

In this method, after a first insulating layer is formed on a substrate, a metal layer is formed on the first insulating layer. The metal layer is selectively etched to form a wiring layer on the first insulating layer. Subsequently, a second insulating layer is formed by sputtering on the first insulating layer to cover the wiring layer in such a way that at least a part of the gaps or spaces between the wiring lines of the wiring layer includes a void or voids.

The material for the second insulating layer is not deposited in the narrow gaps or spaces between the wiring lines during the sputtering process, thereby forming voids in the narrow gaps or spaces in the second insulating layer. The voids have a larger height than that of the wiring lines. In other words, the tops of the voids protrude from the wiring lines.

With the method of forming the wiring structure disclosed in the Japanese Examined Patent Publication No. 7-114236, since the tops of the voids formed in the second insulating layer protrude from the wiring lines, the voids tend to be exposed or opened during a CMP process. Therefore, there is the same problem relating to the CMP process as in the conventional wiring structure shown in FIG. 3.

SUMMARY OF THE INVENTION

Accordingly, an object of the present invention is to provide a semiconductor integrated circuit device that decreases the parasitic capacitance between wiring lines of a wiring layer.

Another object of the present invention is to provide a semiconductor integrated circuit device capable of high-speed operation even for high-level miniaturization.

Still another object of the present invention is to provide a fabrication method of a semiconductor integrated circuit device which is readily performed while preventing the fabrication yield reduction.

The above objects together with others not specifically mentioned will become clear to those skilled in the art from the following description.

According to a first aspect of the present invention, a semiconductor integrated circuit device is provided. This device is comprised of a semiconductor substructure with a main surface, an insulating layer formed on the main surface of the substructure, a first patterned conductive layer formed on the insulating layer to serve as a first-level wiring layer, and an interlevel dielectric layer formed on the insulating layer to cover the first-level wiring layer.

The first-level wiring layer includes a first plurality of wiring lines and a second plurality of wiring lines. The first plurality of wiring lines are located apart from each other at gaps equal to or smaller than a specific value. The second plurality of wiring lines are located apart from each other at gaps larger than the specific value.

The interlevel dielectric layer includes voids selectively located in the gaps of the first plurality of wiring lines, thereby decreasing a parasitic capacitance between the first plurality of wiring lines.

The tops of the voids are lower than the tops of the first-level wiring layer, respectively.

With the semiconductor integrated circuit device according to the first aspect of the present invention, the first plurality of wiring lines of the first-level wiring layer are located apart from each other at the gaps equal to or smaller than the specific value, and the second plurality of wiring lines are located apart from each other at the gaps larger than the specific value. The interlevel dielectric layer includes voids selectively located in the gaps of the first plurality of wiring lines, thereby decreasing the parasitic capacitance between the first plurality of wiring lines. The tops of the voids are lower than the tops of the first-level wiring layer, respectively.

Accordingly, the parasitic capacitance between the first plurality of wiring lines of the first-level wiring layer, where the gaps are equal to or smaller than the specific value, is selectively decreased. This enables high-speed operation of the semiconductor integrated circuit device even for high-level miniaturization.

In a preferred embodiment of the semiconductor integrated circuit device according to the first aspect, the interlayer dielectric layer is formed by a lower dielectric sublayer located on the insulating layer, and an upper dielectric sublayer formed on the lower dielectric sublayer. The voids are located in the lower dielectric sublayer.

In another preferred embodiment of the semiconductor integrated circuit device according to the first aspect, each of the voids between the first plurality of wiring lines of the first-level wiring layer has a cross section equal to at least 5% of a cross section of the corresponding gap. If the cross section of each of the voids between the first plurality of wiring lines of the first-level wiring layer is less than 5% of the cross section between the corresponding gap, the effect of parasitic capacitance reduction is not satisfactorily realized.

In still another preferred embodiment of the semiconductor integrated circuit device according to the first aspect, a second patterned conductive layer is additionally formed on the interlevel dielectric layer to serve as a second-level wiring layer. The surface of the interlevel dielectric layer is planarized by a CMP process.

In this case, the effect of parasitic capacitance reduction is effectively realized.

According to a second aspect of the present invention, a fabrication method of a semiconductor integrated circuit device is provided, which fabricates the semiconductor integrated circuit device according to She first aspect of the present invention.

This method is comprised of the following steps (a) to (d).

(a) A semiconductor substructure with a main surface is prepared.

(b) An insulating layer is formed on the main surface of the substructure;

(c) A first patterned conductive layer serving as a first-level wiring layer is formed on the insulating layer in such a way that the first-level wiring layer includes a first plurality of wiring lines and a second plurality of wiring lines.

The first plurality of wiring lines are located apart from each other at gaps equal to or smaller than a specific value. The second plurality of wiring lines are located apart from each other at gaps larger than the specific value.

(d) An interlevel dielectric layer is formed on the insulating layer to cover the first-level wiring layer by a high-density plasma-enhanced CVD process in such a way that the interlevel dielectric layer includes voids selectively located in the gaps of the first plurality of wiring lines.

The tops of the voids are lower than the tops of the first-level wiring layer, respectively.

A parasitic capacitance between the first plurality of wiring lines is decreased by the voids.

With the fabrication method of a semiconductor integrated circuit device according to the second aspect of the present invention, the first patterned conductive layer serving as the first-level wiring layer is formed on the insulating layer in such a way that the first-level wiring layer includes the first plurality of wiring lines and the second plurality of wiring lines. The first plurality of wiring lines are located apart from each other at the gaps equal to or smaller than the specific value. The second plurality of wiring lines are located apart from each other at the gaps larger than the specific value.

Further, the interlevel dielectric layer is formed on the insulating layer to cover the first-level wiring layer by the high-density plasma-enhanced CVD process in such a way that the interlevel dielectric layer includes voids selectively located in the gaps of the first plurality of wiring lines. The tops of the voids are lower than the tops of the first-level wiring layer, respectively. In other words, the interlevel dielectric layer is formed on the insulating layer while controlling the step coverage characteristic of the interlevel dielectric layer.

Accordingly, the parasitic capacitance between the first: plurality of wiring lines of the first-level wiring layer, where the gaps are equal to or smaller than the specific value, is selectively decreased. This enables high-speed operation of the semiconductor integrated circuit device even for high-level miniaturization.

In a preferred embodiment of the fabrication method according to the second aspect, the step of forming the interlayer dielectric layer is realized by forming a lower dielectric sublayer on the insulating layer, and by forming an upper dielectric sublayer on the lower dielectric sublayer. The voids are located in the lower dielectric sublayer. The upper dielectric sublayer is grown at a lower growth rate than that of the lower dielectric sublayer to prevent generation of voids in the upper dielectric sublayer.

In this case, there is an additional advantage that higher voids than the first plurality of wiring lines are surely prevented from occurring in the interlayer dielectric layer.

In another preferred embodiment of the method according to the second aspect, the high-density plasma-enhanced CVD process is performed under application of a radio-frequency (RF) bias voltage while generating Electron Cyclotron Resonance (ECR) plasma.

In this case, there is an additional advantage that the wanted voids are formed in the interlevel dielectric layer.

BRIEF DESCRIPTION OF THE DRAWINGS

In order that the invention may be readily carried into effect, it will now be described with reference to the accompanying drawings.

DETAILED DESCRIPTION OF THE PREFERRED EMBODIMENTS

Figure 1:
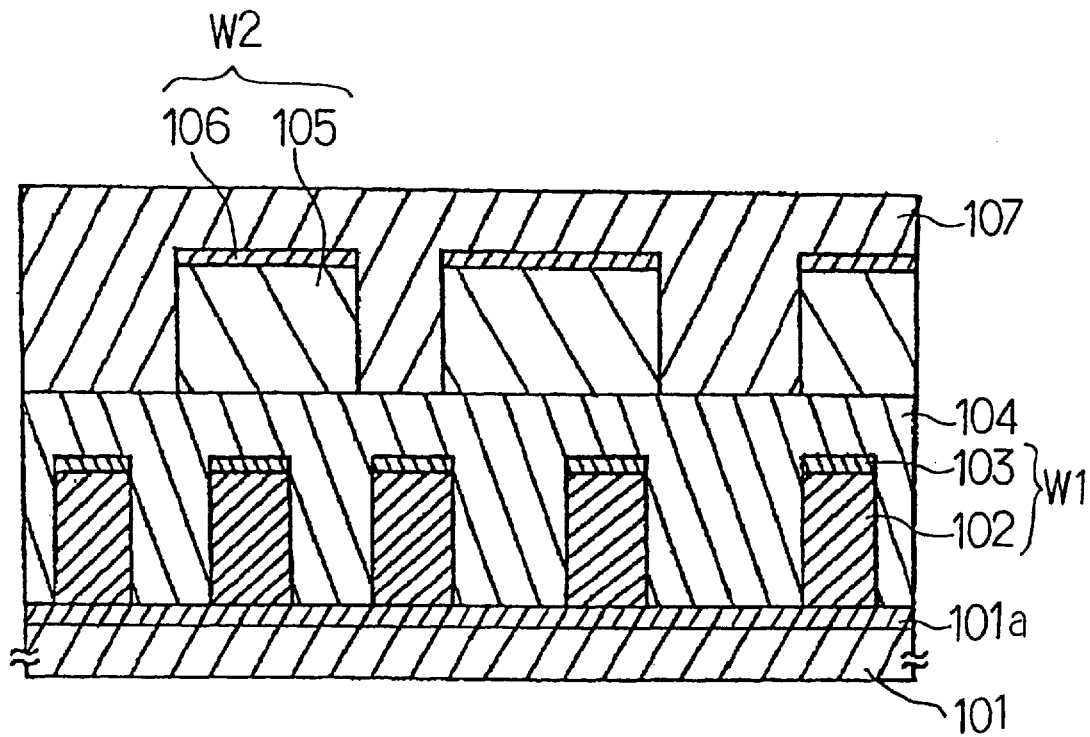
FIG. 1 is a schematic, partial cross sectional view of a conventional semiconductor integrated circuit device.
Figure 2A:
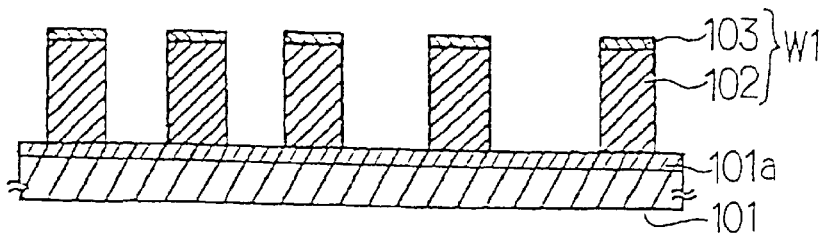
FIGS. 2A to 2C are schematic, partial cross sectional views showing a fabrication process sequence of the conventional semiconductor integrated circuit device in FIG. 1.
Figure 2B:
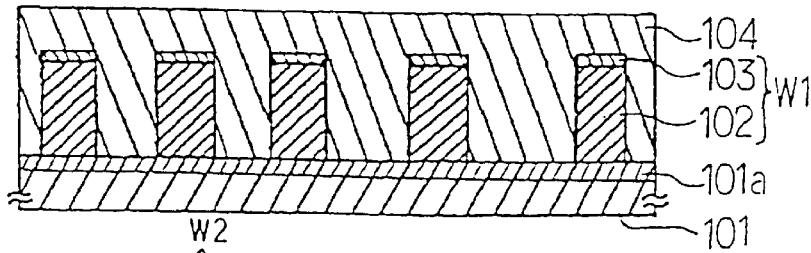
Figure 2C:
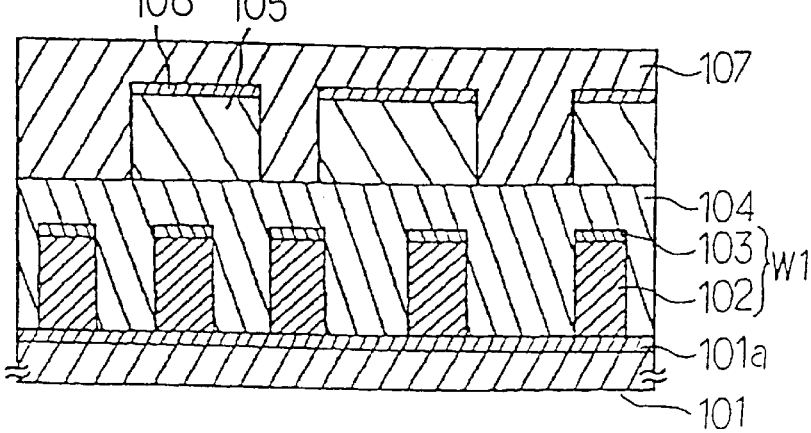
Figure 3:
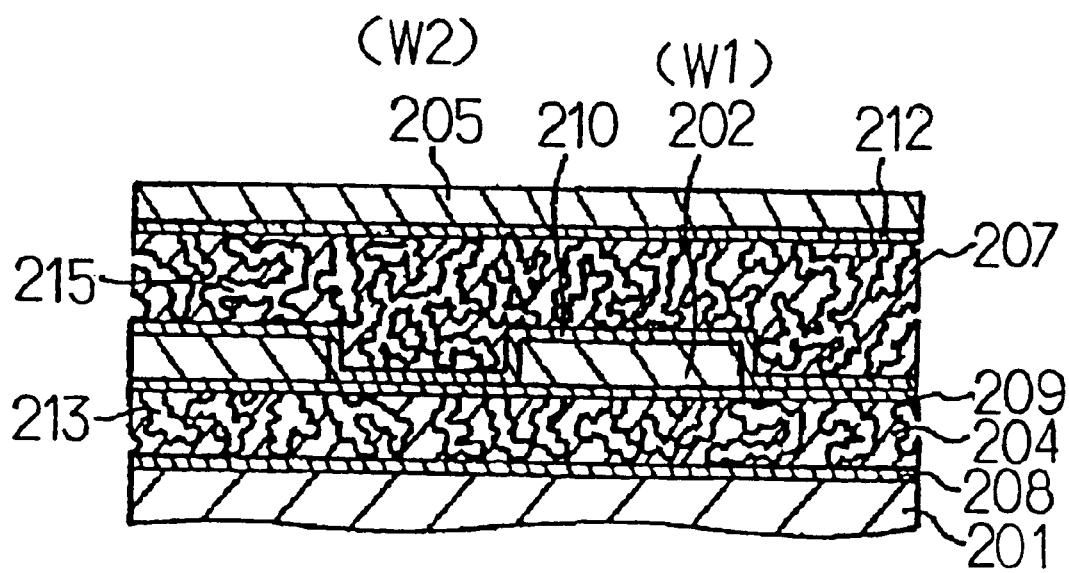
FIG. 3 is a schematic, partial cross sectional view of another conventional semiconductor integrated circuit device.
Figure 4A:
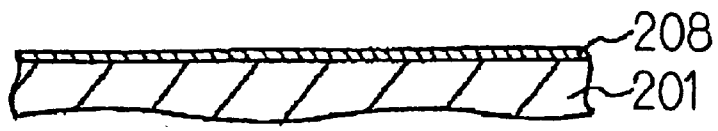
FIGS. 4A to 4E are schematic, partial cross sectional views showing a fabrication process sequence of the conventional semiconductor integrated circuit device in FIG. 3.
Figure 4B:
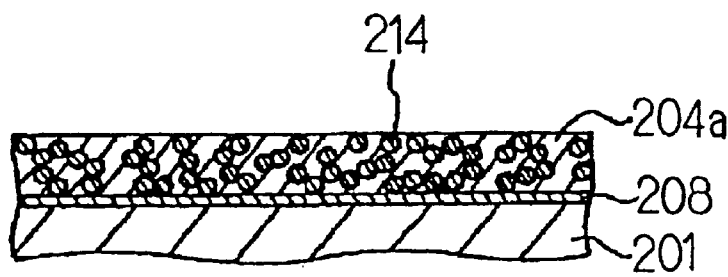
Figure 4C:
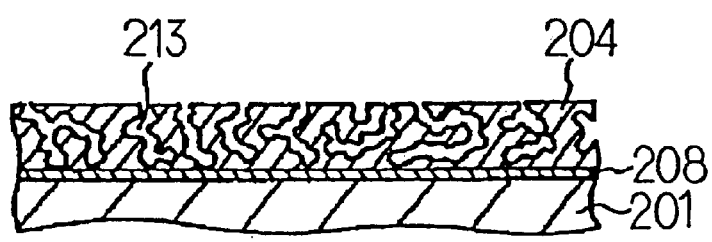
Figure 4D:
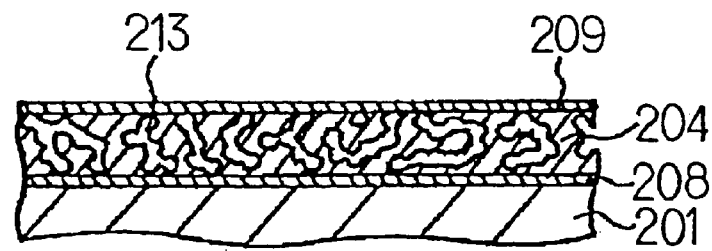
Figure 4E:
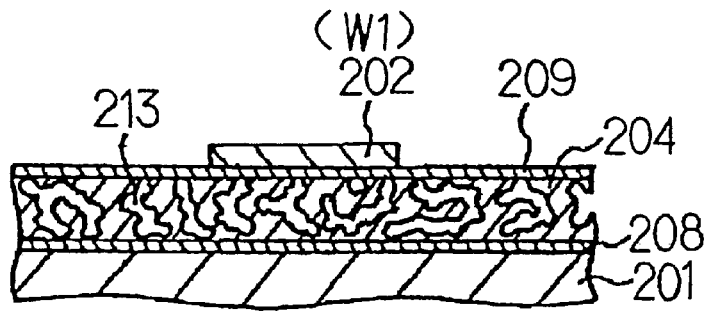

Preferred embodiments of the present invention will be described below referring to the drawings attached.

First Embodiment

Figure 5:
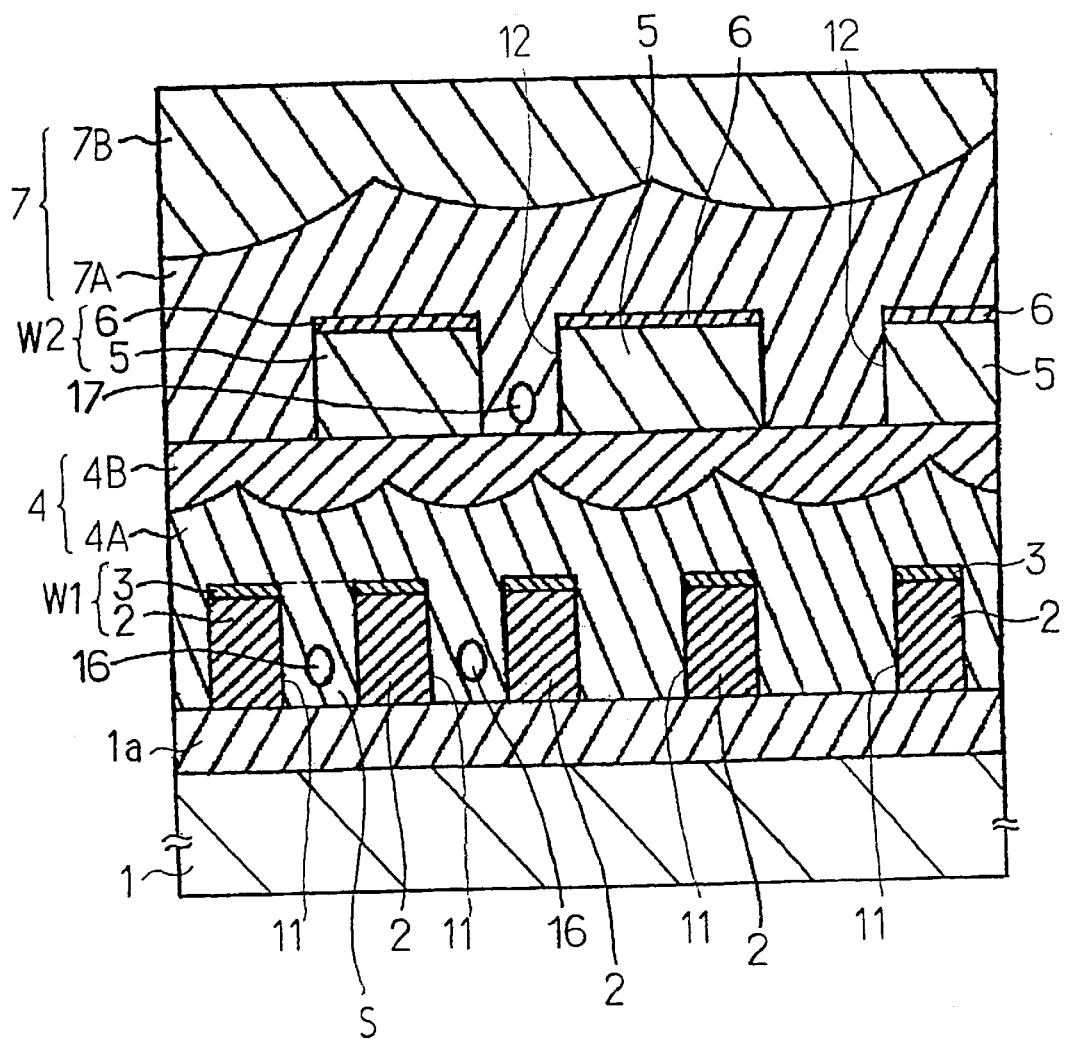
FIG. 5 is a schematic, partial cross sectional view of a semiconductor integrated circuit device according to a first embodiment of the present invention.

As shown in FIG. 5, a semiconductor integrated circuit device according to a first embodiment includes a semiconductor substructure 1. The substructure 1 is typically comprised of a silicon substrate and a field oxide formed on the substrate, or of a silicon substrate and an interlevel dielectric layer formed on or over the substrate. Various semiconductor elements such as transistors are formed in the substructure 1. The substructure 1 further includes an insulating layer 1a located on the top of the substructure 1.

A patterned conductive layer 2 is formed on the insulating layer 1a. A patterned anti-reflection layer 3 is formed on the conductive layer 2. The combination of the conductive layer 2 and the anti-reflection layer 3 serves as a first-level wiring layer W1.

The first-level wiring layer W1 has a height of 0.8 $\mu$m, which is measured from the surface of the underlying insulating layer 1a of the substructure 1 to the top of the anti-reflection layer 3. The spacing of the wiring gaps or spaces 11 of the first-level wiring layer W1, which is defined as a distance between the adjoining wiring lines of the first-level wiring layer W1, is 0.4 $\mu$m the narrowest.

An interlevel dielectric layer 4 is formed on the insulating layer 1a to cover the first-level wiring layer W1. The wiring layer W1 is entirely buried in the dielectric layer 4. The layer 4 is formed by two sublayers; a lower $SiO_2$ sublayer 4A and an upper $SiO_2$ sublayer 43. The lower $SiO_2$ sublayer 4A is formed on the insulating layer 1a to cover the underlying first-level wiring layer W1. Here, the wiring layer W1 is entirely buried in the lower $SiO_2$ sublayer 4A. The upper $SiO_2$ sublayer 4B is formed in the lower $SiO_2$ sublayer 4A.

As shown in FIG. 5, the wiring layer W1 has voids 16 in the narrowest gaps 11 of 0.4 $\mu$m between the adjoining wiring lines of the layer W1, respectively. However, no voids exist in the relatively wide gaps 11 of greater than 0.4 $\mu$m between the adjoining wiring lines of the layer W1, respectively. The height of the voids 16 is much lower than that of the lower $SiO_2$ sublayer 4A and the wiring layer W1.

The upper $SiO_2$ sublayer 4B has no voids. The surface of the sublayer 4B is planarized by a CMP process.

A patterned conductive layer 5 is formed on the interlayer dielectric layer 4, i.e., the upper SiO, sublayer 4B. A patterned anti-reflection layer 6 is formed on the conductive layer 5. The combination of the conductive layer 5 and the anti-reflection layer 6 serves as a second-level wiring layer W2.

The second-level wiring layer W2 has a same height of 0.8 $\mu$m as that of the first-level wiring layer W1, which is measured from the surface of the $SiO_2$ sublayer 4B of the interlevel dielectric layer 4 to the top of the anti-reflection layer 6. The spacing of the wiring gaps or spaces 12 of the second-level wiring layer W2, which is defined as a distance between the adjoining wiring lines of the second-level wiring layer W2, is 0.4 $\mu$m at the narrowest.

Each of the voids 16 has a cross section equal to at least 5% of the cross section S of the corresponding gap 11. The cross section S has a same height as that of the wiring layer W1.

An interlevel dielectric layer 7 is formed on the interlevel dielectric layer 4 to cover the second-level wiring layer W2. The wiring layer W2 is entirely buried in the Dielectric layer 7. The layer 7 is formed by two sublayers; a lower $SiO_2$ sublayer 7A and an upper $SiO_2$ sublayer 7B. The lower $SiO_2$ sublayer 7A is formed on the interievel dielectric layer 4 to cover the second-level wiring layer W2. Here, the wiring layer W2 is entirely buried in the lower $SiO_2$ sublayer 7A. The upper $SiO_2$ sublayer 7B is formed on the lower $SiO_2$ sublayer 7A."

As shown in FIG. 5, the wiring layer W2 has voids 17 in the narrowest gaps 12 of 0.4 $\mu$m between the adjoining wiring lines of the layer W2, respectively. However, no voids exist in the relatively wide gaps 12 of greater than 0.4 $\mu$m between the adjoining wiring lines of the layer W2, respectively. The height of the voids 17 is much lower than that of the lower $SiO_2$ sublayer 7A and the layer W2.

The upper $SiO_2$ sublayer 7B has no voids. The surface of the sublayer 7B is planarized by a CMP process.

The semiconductor integrated circuit device according to the first embodiment in FIG. 1 is fabricated by the following process steps.

Figure 6A:
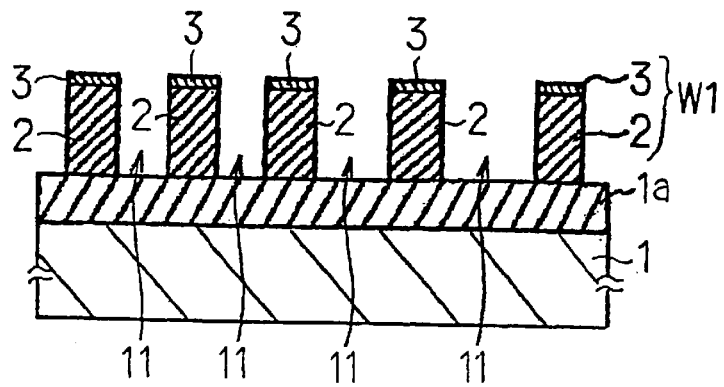
FIGS. 6A to 6E are schematic, partial cross sectional views showing a fabrication process sequence of the semiconductor integrated circuit device according to the first embodiment in FIG. 5.

First, as shown in FIG. 6A, the semiconductor substructure 1 including specific semiconductor elements is prepared.

Next, as the conductive layer 2, an Al—Si—Cu alloy layer with a thickness of approximately 0.7 $\mu$m is formed on the insulating layer 1a of the substructure 1 by a sputtering process or the like. As the anti-reflection layer 3, a TiN layer with a thickness of approximately 75 $\mu$m is formed on the Al—Si—Cu alloy layer by a sputtering process or the like. The two layers thus formed are then patterned to a specific geometric shapes by photolithography and etching processes, thereby forming the first-level wiring layer W1. The state at this stage is shown in FIG. 6A.

Figure 6B:
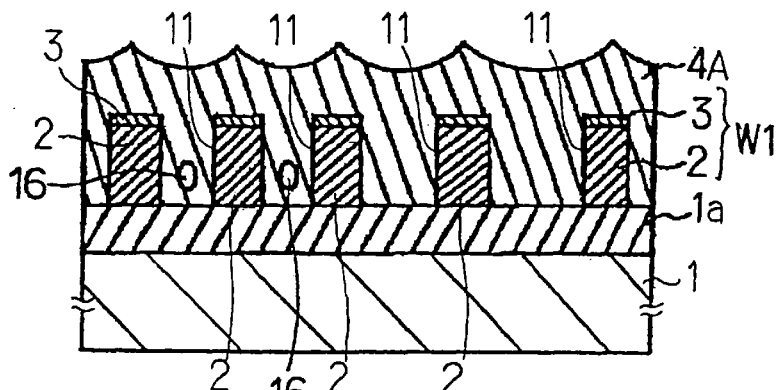

Subsequently, the lower $SiO_2$ sublayer 4A is deposited on the exposed insulating layer 1a of the substructure 1 by a bias CVD process using high-density plasma (for example, bias ECR-CVD process). Thus, the first-level wiring layer W1 is entirely buried in the sublayer 4A, as shown in FIG. 6B.

Through this CVD process, the voids 16 are selectively formed in the narrowest gaps 11 of 4 $\mu$m between the wiring lines of the first-level wiring layer W1. No voids are generated in the relatively wider gaps 11 of greater than 4 $\mu$m. The height of the voids 16 is much lower than that of the wiring layer W1.

A preferred CVD condition for forming the lower SiO sublayer 4A is as follows.

As a reaction gas, a gaseous mixture of silane ($SiH_4$), oxygen ($O_2$), and argon (Ar) is used. In this case, a volume ratio of silane and oxygen is set as 1:1 to 1:2, and a volume ratio of silane and argon is set as 1:0.6 to 1:2.8.

An electric power (i.e., microwave power at 2.45 GHz) for generating the high-density plasma is set as 1.0 to 3.0 kw.

An electric power (i.e., RF power at 13.56 MHz) for biasing is set as 5.7 to 17 $kW/cm^2$.

The flow rate of the reaction gas and the microwave and RF electric power are adjusted in such a way that a good-quality $SiO_2$ layer is deposited.

For example, when the flow rate of a silane gas is set as 100 sccm, the flow rate of an oxygen gas is set as 200 sccm, the flow rate of an argon gas is set as 100 sccm, the microwave power is set as 1.75 kW, and the RF bias power is set as 13 $kW/cm^2$, voids 16 with an eliptic cross section are selectively formed in the narrowest gaps of 0.4 µm between the wiring lines. The long and short axes of the eliptic cross section are approximately 0.25 µm and 0.12 µm, respectively. In this case, the dielectric constant between the adjoining wiring lines is lower than that of $SiO_2$ by approximately 8%.

If the flow rate of the reaction gas is excessively low, or the biasing power is excessively high, no void are generated even in the narrowest gaps of 0.4 µm. Contrarily, if the flow rate of the reaction gas is excessively high, or the biasing power is excessively low, voids are generated not only in the narrowest gaps of 0.4 µm but also in the relatively wider gaps of greater than 0.4 µm, or the voids become higher than the first-level wiring line W1.

Figure 6C:
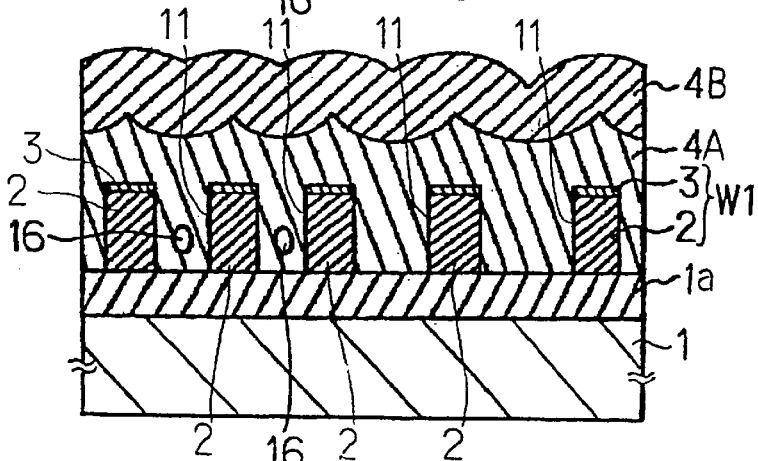

Subsequently, the upper $SiO_2$ sublayer 4B is formed on the lower $SiO_2$ sublayer 4A by a plasma-enhanced CVD process, in which the deposition or growth rate is higher than that in the process for the lower $SiO_2$ sublayer 4A. The state at this stage is shown in FIG. 6C. This higher deposition or growth rate will raise the fabrication yield. Instead of the plasma-enhanced CVD process, the same CVD process as that in the process for lower $SiO_2$ sublayer 4A may be used.

Figure 6D:
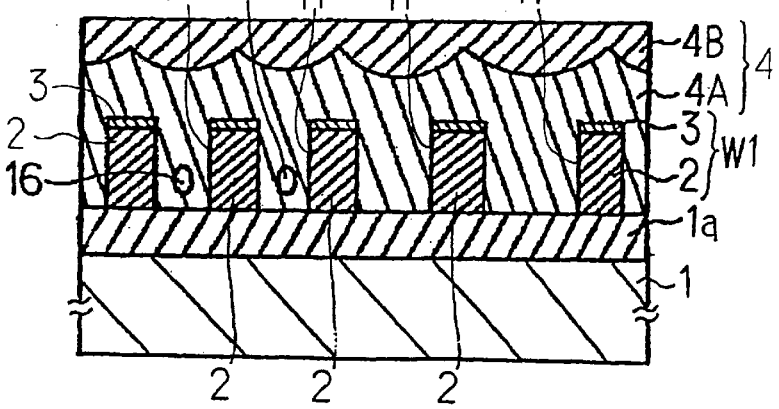
Figure 6E:
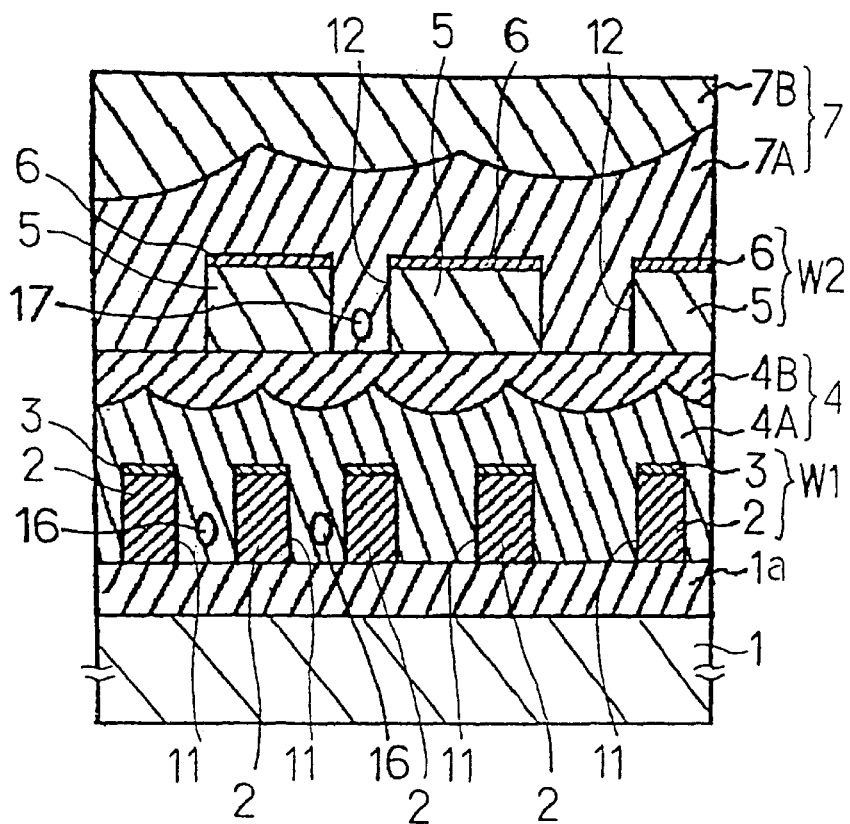

The surface of the upper $SiO_2$ sublayer 4B is then planarized by a CMP process. The state at this stage is shown in FIG. 6D.

Further, the same process steps as those for the first level-wiring layer W1 are repeated for the second level-wiring layer W2. Thus, the second level-wiring layer W2 is formed on the interlevel dielectric layer 4, resulting in the two-level wiring structure.

With the semiconductor integrated circuit device according to the first embodiment, a part of the wiring lines of the first-level wiring layer W1 are located apart from each other at the narrowest gaps 11 of 4 µm, and the remaining wiring lines are located apart from each other at the gaps 11 of larger than 4 µm. The interlevel dielectric layer 4 includes the voids 16 selectively located in the narrowest gaps 11 of 4 µm of the wiring lines. The tops of the voids 16 are much lower than the tops of the first-level wiring layer W1, respectively.

The same description as that for the first-level wiring layer W1 is applied for the second-level wiring layer W2.

Accordingly, the parasitic capacitance between the wiring lines of the first- and second-level wiring layers W1 and W2, where the gaps 11 and 12 are equal to 4 µm and therefore the parasitic capacitance tends to be large, is selectively decreased. This enables high-speed operation of the semiconductor integrated circuit device even for highlevel miniaturization.

On the other hand, since no voids are generated in the gaps 11 and 12 of greater than 4 µm in the first- and second-level wiring layers W1 and W2, a satisfactory supporting strength for the wiring layers W1 and W2 can be realized without lowering the circuit operation speed.

Further, because the voids 16 and 17 are located in the lower levels than the tops of the wiring layers W1 and W2, respectively, the passivation function lowering or degradation of the interlevel dielectric layers 4 and 7 due to the existence of the voids 16 and 17 is suppressed. This facilitates the surface planarization of the interlevel dielectric layers 4 and 7 by a CMP process and the fabrication of the semiconductor integrated device.

With the fabrication method of the semiconductor integrated circuit device according to the first embodiment, by suitably controlling the RF biasing power, and the composition ratio and flow rate of the reaction gas, the voids 16 and 17 can be selectively formed in the gaps 11 and 12.

Second Embodiment

Figure 7:
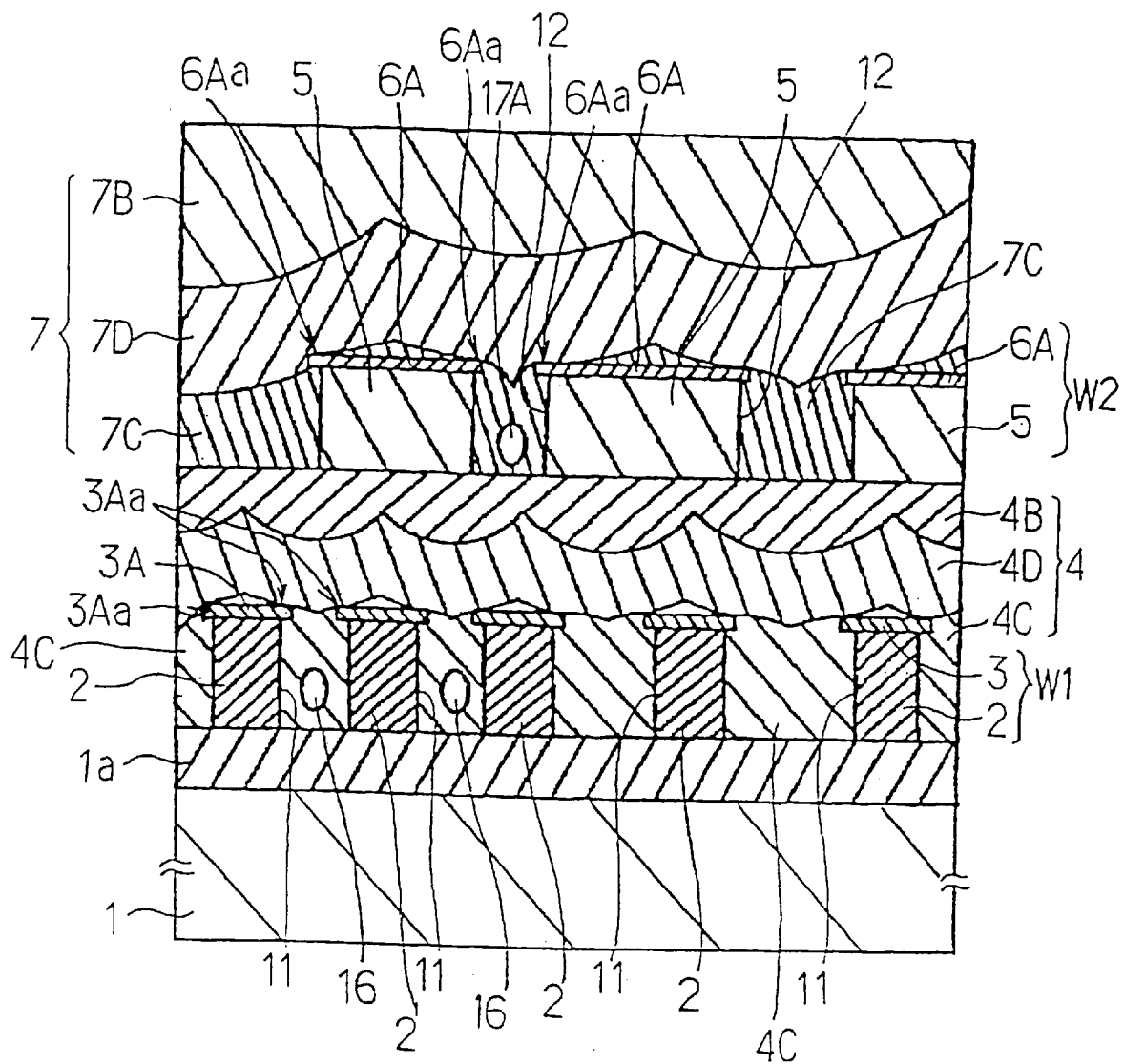
FIG. 7 is a schematic, partial cross sectional view of a semiconductor integrated circuit device according to a second embodiment of the present invention.

A semiconductor integrated circuit device according to a second embodiment is shown in FIG. 7, which is the same in configuration as that according to the first embodiment, except for the shape of anti-reflection layers 3A and 6A and the structure of sublayers 4C and 4D and 7C and 7D. Therefore, by adding the same reference characters to the corresponding elements in FIG. 7, the description relating to the same configuration is omitted here for the sake of simplification of description.

In the device according to the second embodiment, as shown in FIG. 7, the anti-reflection layers 3A and 6A have overhangs 3Aa and 6Aa laterally protruding from the side surfaces of the underlying wiring lines of the first- and second-level wiring layers W1 and W2, respectively. The protruding length of the overhangs 3Aa and 6Aa is here 20 to 80 nm.

The overhangs 3Aa and 6Aa are generated by a side etching action during the etching (or patterning) process for the conductive layers 2 and 5, respectively. For example, these overhangs 3Aa and 6Aa tend to be generated when the conductive layers 2 and 5 are anisotropically etched using a hard mask such as a patterned $SiO_2$ layer by a reactive ion etching process while protecting the etched side surfaces of the conductive layers 2 and 5 by non-volatile reaction products. In this case, if the protection by the non-volatile reaction products is not sufficient, the etched side surfaces of the conductive layers 2 and 5 tend to be laterally etched further, resulting in the overhangs 3Aa and 6Aa.

Unlike the first embodiment, the interlevel dielectric layer 4 is formed by three $SiO_2$ sublayers 4C, 4D and 4B.

The lower $SiO_2$ sublayer 4C is formed on the insulating layer 1a in such a way that the top of the sublayer 4C is approximately equal to or slightly lower than that of the anti-reflection layer 3A in the narrowest gaps 11. The voids 16 are formed in the sublayer 4C.

The middle $SiO_2$ sublayer 4D is formed on the lower sublayer 4C at a lower growth rate than that for the lower $SiO_2$ sublayer 4C in order not to generate any voids.

The total thickness of the lower and middle $SiO_2$ sublayers 4C and 4D is set as equal to the thickness of the lower $SiO_2$ sublayer 4A in the first embodiment.

The same description as that for the interlevel dielectric layer 4 is applied to the interlevel dielectric layer 7.

In the second embodiment, together with the same advantages as those in the first embodiment, there is an additional advantage that the void generation higher than the wiring layers W1 and W2 is surely prevented.

The semiconductor integrated circuit device according to the second embodiment in FIG. 7 is fabricated by the following process steps.

Figure 8A:
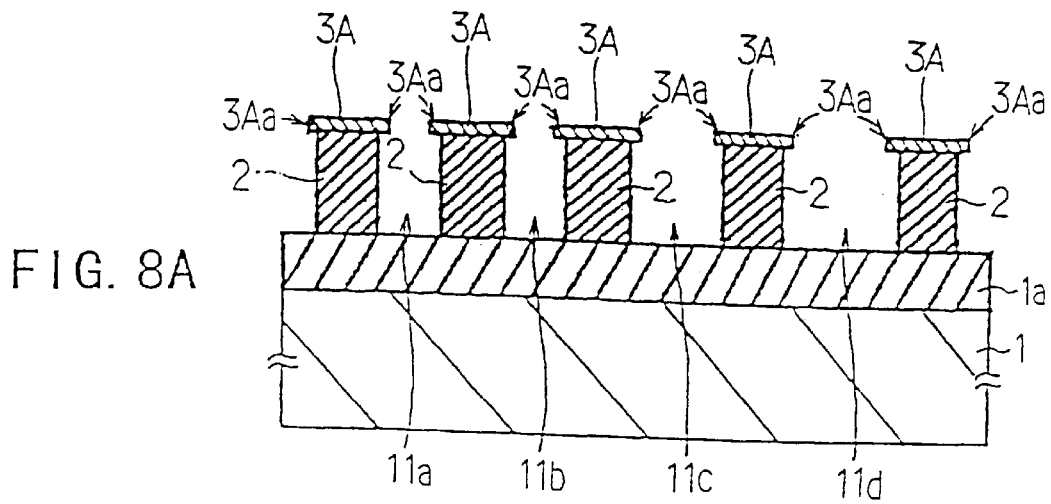
FIGS. 8A to 8C are schematic, partial cross sectional views showing a fabrication process sequence of the semiconductor integrated circuit device according to the second embodiment in FIG. 7.

First, as shown in FIG. 8A, the semiconductor substructure 1 including specific semiconductor elements is prepared.

Next, as the conductive layer 2, an Al—Si—Cu alloy layer with a thickness of approximately 0.7 μm is formed on the insulating layer 1a of the substructure 1 by a sputtering process or the like. As the anti-reflection layer 3A, a TiN layer with a thickness of approximately 75 nm is formed on the Al—Si—Cu alloy layer by a sputtering process or the like. The two layers thus formed are then patterned to a specific geometric shapes by photolithography and etching processes, thereby forming the first-level wiring layer W1. The state at this stage is shown in FIG. 8A.

Subsequently, the lower $SiO_2$ sublayer 4C is deposited on the exposed insulating layer 1a of the substructure 1 by a bias CVD process using high-density plasma. Thus, almost all of the first-level wiring layer W1 is buried in the sublayer 4C.

Figure 8B:
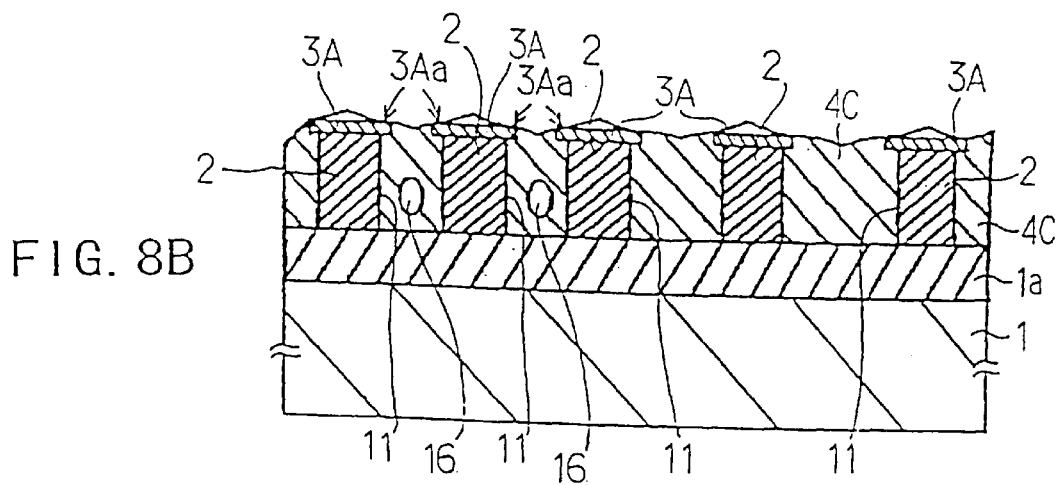

Through this CVD process, the voids 16 are selectively formed in the narrowest gaps 11 of 4 μm between the wiring lines of the first-level wiring layer W1. No voids are generated in the relatively wider gaps 11 of greater than 4 μm. The height of the voids 16 is much lower than that of the wiring layer W1. The state at this stage is shown in FIG. 8B.

Subsequently, the middle $SiO_2$ sublayer 4D is formed on the lower $SiO_2$ sublayer 4C by a plasma-enhanced CVD process, in which the deposition or growth rate is lower than that in the process for the lower $SiO_2$ sublayer 4C. This lower deposition or growth rate will delete the possibility of void generation in the middle $SiO_2$ sublayer 4D.

Following this, the upper SiO sublayer 4B is formed on the middle $SiO_2$ sublayer 4D by a plasma-enhanced CVD process, in which the deposition or growth rate is higher than that in the process for the lower $SiO_2$ sublayer 4C. This higher deposition or growth rate will raise the fabrication yield.

Figure 8C:
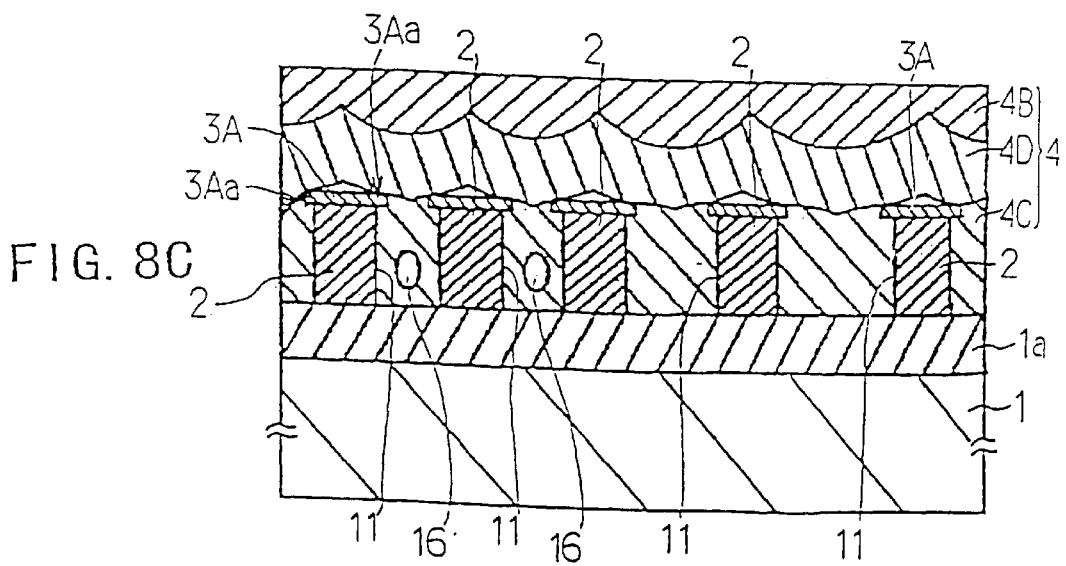

The surface of the upper $SiO_2$ sublayer 4B is then planarized by a CMP process. The state at this stage is shown in FIG. 8C.

Further, the same process steps as those for the first level-wiring layer W1 are repeated for the second level-wiring layer W2. Thus, the second level-wiring layer W2 is formed on the interlevel dielectric layer 4, resulting in the two-level wiring structure.

In the above first and second embodiments, ECR plasma is used as the high-density plasma. However, helicon-wave plasma and Inductively Coupled Plasma (ICP) may be used. Although the gaseous mixture of silane, oxygen, and argon is used in the embodiments as the reaction gas, any other gaseous mixture of (a) at least one of silane and tetraethylorthosilicate (i.e., tetraethoxysilane, TEOS) and (b) at least one of argon, helium, oxygen, ozone, nitrous oxide, nitrogen monooxide, and nitrogen dioxide may be used.

Further, substantially pure $SiO_2$ is used as the dielectric sublayers in the embodiments. However, it is preferred that a $SiO_2$ layer containing fluorine (F) atoms at an atomic percentage of 2 to 15 is used as the dielectric sublayers, because the dielectric constant is lowered by approximately 10% with respect to a $SiO_2$ layer.

The dielectric sublayer may be formed by any plasma-enhanced CVD process such as a bias CVD process if the reaction gas is a gaseous mixture of (a) at least one of silane and TEOS, (b) at least one of oxygen, argon, nitrous oxide, nitrogen monooxide, and nitrogen dioxide, and (c) tetrafluoromethane and hexafluoromethane. Alternately, the dielectric sublayer may be formed by any plasma-enhanced CVD process such as a bias CVD process if the reaction gas is a gaseous mixture of (a) tetrafluorosilicon, and (b) at least one of oxygen, argon, nitrous oxide, nitrogen monooxide, and nitrogen dioxide.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. A fabrication method of a semiconductor integrated circuit device comprising:
    (a) preparing a semiconductor substructure with a main surface;
    (b) forming an insulating layer on the main surface of said substructure;
    (c) forming a first patterned conductive layer serving as a first-level wiring layer on said insulating layer in such a way that the first-level wiring layer includes a first plurality of wiring lines and a second plurality of wiring lines;
        said first plurality of wiring lines being located apart from each other at gaps equal to or smaller than a specific value;
        said second plurality of wiring lines being located apart from each other at gaps larger than the specific value; and
    (d) forming an interlevel dielectric layer on said insulating layer to cover said first-level wiring layer by a high-density plasma-enhanced CVD process in such a way that said interlevel dielectric layer includes voids selectively located in the gaps of said first plurality of wiring lines;
        the tops of the voids being lower than the tops of said first-level wiring layer, respectively;
        whereby a parasitic capacitance between said first plurality of wiring lines is decreased by said voids.

2. The method as claimed in claim 1, wherein the step of forming said interlayer dielectric layer is realized by forming a lower dielectric sublayer on said insulating layer, and by forming an upper dielectric sublayer on said lower dielectric sublayer;
    and wherein said voids are located in said lower dielectric sublayer;
    and wherein said upper dielectric sublayer is grown at a lower growth rate than that of said lower dielectric sublayer to prevent generation of voids in said upper dielectric sublayer.

3. The method as claimed in claim 1, wherein the high-density plasma-enhanced CVD process is performed under application of a RF bias voltage while generating ECR plasma.

4. The method as claimed in claim 1, wherein said interlevel-dielectric layer is formed by a silicon dioxide layer.

5. A fabrication method for making a semiconductor integrated circuit device, said method comprising:
    (a) preparing a semiconductor substructure having a main surface;
    (b) forming an insulating layer on the main surface of said substructure;

(c) forming a first-level patterned conductive layer forming a first-level wiring layer on said insulating layer, the first-level wiring layer including a first plurality of wiring lines and a second plurality of wiring lines;

said first plurality of wiring lines being at locations spaced apart from each other with gaps equal to or smaller than a specific value;

said second plurality of wiring lines being at locations spaced apart from each other with gaps larger than the specific value; and (d) forming an inter-level dielectric layer on said insulating layer to cover said first-level wiring layer by a high-density plasma-enhanced CVD process in such a way that said inter-level dielectric layer includes voids selectively located in the gaps of said first plurality of wiring lines;

whereby a parasitic capacitance between said first plurality of wiring lines is decreased by said voids.

6. The method of claim 5 wherein said first-level wiring layer has peaks on its upper surface and said voids have tops which are lower than said peaks on said first-level wiring level.

7. The method of either claim 1 or claim 5 where said voids have a cross section equal to at least 5% of the width of gaps of said first plurality of wiring lines.

8. The method of claim 7 wherein the space between said gaps is at least 0.4 mm.

9. The method of either claim 1 or claim 5 wherein said voids have a cross section relative to a width of the gap between said first plurality of wiring lines which decreases parasitic capacitance between said lines.

10. The method of either claim 1 or claim 5 wherein there are two interlayer dielectric layers, one of said interlayer being a lower layer formed on the insulating layer of step (b), the other of said interlayer dielectric layers being an upper dielectric layer formed on said lower dielectric level, said lower dielectric layer being grown at a particular growth rate which produces voids therein, and said upper dielectric layer being grown at a growth rate which is slower than said particular growth rate in order to prevent a formation of said voids in said upper dielectric layer.

11. The method of either claim 1 or claim 5 wherein a radio-frequency bias voltage is applied while said CVD process of step (d) is occurring.

12. The method of claim 11 wherein said radio-frequency voltage is applied to generate an electron cyclotron resonance plasma.

13. The method of claim 12 wherein said radio-frequency is in a range of about 13–14 MHz and the voltage is in the range of about 5.7–17 kW/cm$^2$.

* * * * *